(12) United States Patent
Brennan et al.

(10) Patent No.: US 6,697,293 B2
(45) Date of Patent: *Feb. 24, 2004

(54) LOCALIZED DIRECT SENSE ARCHITECTURE

(75) Inventors: Ciaran J. Brennan, Essex Junction, VT (US); John A. Fifield, Underhill, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 10/063,329

(22) Filed: Apr. 12, 2002

(65) Prior Publication Data

US 2003/0193828 A1 Oct. 16, 2003

(51) Int. Cl.⁷ .............................. G11C 7/06; G11C 7/18
(52) U.S. Cl. ...................... 365/207; 365/208; 365/222
(58) Field of Search ............................... 365/207, 208, 365/222

(56) References Cited

U.S. PATENT DOCUMENTS

| | | | |
|---|---|---|---|
| 5,831,919 A | 11/1998 | Haukness et al. | 365/205 |
| 5,848,001 A | 12/1998 | Kim | 365/190 |
| 5,926,422 A | 7/1999 | Haukness | 365/201 |
| 6,072,749 A | 6/2000 | Nakamura et al. | 365/238.5 |
| 6,128,238 A | 10/2000 | Nagai et al. | 365/207 |
| 6,205,076 B1 | 3/2001 | Wakayama et al. | 365/222 |
| 6,438,051 B1 * | 8/2002 | Fifield et al. | 365/207 |
| 6,552,944 B2 * | 4/2003 | Fifield et al. | 365/208 |

FOREIGN PATENT DOCUMENTS

JP  5062463 A  3/1993

* cited by examiner

*Primary Examiner*—Richard Elms
*Assistant Examiner*—Jung H. Hur
(74) *Attorney, Agent, or Firm*—Scully, Scott, Murphy & Presser; Robert A. Walsh, Esq.

(57) ABSTRACT

A localized direct sense architecture circuit includes a large number (e.g. 8) of microcells, each having a primary sense amp PSA, coupled to one global data line which is coupled to one secondary sense amp SSA. Each PSA includes its own bias current device, which supplies bias current to sense devices in the PSA and is also used for precharge, such that the bias current does not flow along the highly capacitive global data line. With this technical approach, the size of each bias current supply device can be substantially reduced, and the number of PSAs on one global data line can be increased for increased layout density.

12 Claims, 4 Drawing Sheets

Localized Direct Sense

Localized Direct Sense

LOCALIZED DIRECT SENSE ARCHITECTURE

BACKGROUND OF THE INVENTION

1. Field of the Invention

The present invention relates generally to a localized direct sense architecture, and more particularly pertains to a localized direct sense architecture which includes a large number (e.g. 8) of microcells, each having a primary sense amp PSA, coupled to one global data line which is coupled to one secondary sense amp SSA. Each PSA includes its own bias current device, which supplies bias current to sense devices in the PSA and is also used for precharge, such that the bias current does not flow along the highly capacitive global data line. With this technical approach, the size of each bias current supply device can be substantially reduced, and the number of PSAs on one global data line can be increased for greater layout density.

2. Discussion of the Prior Art

Direct sense memory arrays are memory arrays wherein only the gate of the sense device/transistor is connected to a sensed bitline BL, such that the sense device does not provide any feedback to or alter the signal on the sensed bitline BL. This is in contrast to other prior art nondirect sense memory arrays which include a cross coupled latch wherein typically both the gate and the drain of a sense device/transistor are connected to a sensed bitline BL, and wherein the sense device provides feedback to and alters the signal on the sensed bitline BL.

Direct sense memory arrays typically use a dense and high speed primary sense amp (PSA) which does not latch sensed data during a read operation, and the sensed data is typically directed to an external cache, from which it is written back into the memory array during a refresh operation, which is a very time consuming operation and also requires the use of the external cache which could otherwise be performing other functions in the system. As such, an accessed memory storage cell does not get directly written back, or restored, after a read operation, but rather has an indirect writeback or restore operation. The basic direct sense read operation is described in U.S. Pat. No. 6,552,944 and entitled Single Bitline Direct Sensing Architecture.

Prior art stabilized direct sense circuits typically mix a bias current generated by a bias current device in a secondary sense amp (SSA) with a signal current along a global data line (PDL). The bias current device is located within the secondary sense amp SSA which is shared by a plurality of n primary sense amps (PSAs) coupled along the global data line PDL, such that the bias current must flow along the highly capacitive global data line PDL.

In the prior art, an array of typically 4 primary sense amps PSAs are connected to one secondary sense amp SSA along a global data line PDL. FIG. 1 illustrates a typical prior art direct sense circuit wherein 4 microcells, each having an associated primary sense amp PSA, are coupled to one global data line PDL, which is coupled to one secondary sense amp SSA having a relatively large bias current supply and a relatively large inverting latch.

Each primary sense amp PSA is relatively simple and typically comprises only:

(1) a pair of NFET devices for sensing and enable;
(2) a pair of write devices;
(3) a pair of bitline restore devices.

The secondary sense amp SSA typically comprises, as illustrated in FIG. 1: 1) a bias current supply device T1 to bias the PSA at its reference level;

(2) a switch T2 to disable the bias current;
(3) an amplifying Inverting Latch, which is typically a cross coupled latch with an internal isolation device;
(4) an output NFET device T3;
(5) a precharge device T4;
(6) a write device T5;
(7) a restore device T6 with 2 buffers.

In the prior art circuit of FIG. 1, the size of the current supply devices T1, T2 must be balanced to the size of the sense devices (which are analogous to the sense devices T9, T12 in the PSA of FIG. 3) to correctly bias the PDL node (analogous to node S in FIG. 3) between data 0 and data 1 responses, which is accomplished with relatively large size devices. However, a problem with this prior art approach is that the relatively large capacitance of the common global data line requires the use of a relatively large size sense device to achieve a high speed operation (which means that the sizes of all of the current supply and switch devices must be increased in proportion) and limits the number of PSAs that can be placed on and coupled to the common global data line.

SUMMARY OF THE INVENTION

Accordingly, it is a primary object of the present invention to provide a localized direct sense architecture which places a bias current supply device in each primary direct sense amplifier PSA, such that the bias current does not flow through the global data line PDL, and removes a bias current supply device from the secondary sense amp SSA, where it is normally placed in the prior art. Thus, the bias current is used locally in an active PSA and does not flow along the global data line PDL, which only switches data related current.

The present invention relates to a localized direct sense architecture which includes a large number of microcells, each having a primary sense amp PSA, coupled to one global data line which is coupled to one secondary sense amp SSA. Each PSA includes its own bias current device, which supplies bias current to sense devices in the PSA and is also used for precharge, such that the bias current does not flow along the highly capacitive global data line. With this technical approach, the size of each bias current supply device can be substantially reduced, and the number of PSAs on one global data line can be increased for greater layout density.

The localized direct sense architecture of the present invention results in a smaller sensing system, smaller current supply devices, and faster PDL performance. The size of the direct sense devices and their enable devices can be reduced because the capacitance to which they are coupled is limited to the capacitance within the primary sense amp PSA and does not include the capacitance of a global data line. Hence, one advantageous feature of the present invention is that a higher speed, higher bandwidth design can be achieved with lower currents and with smaller devices than in prior art circuits. Moreover, the size of the secondary sense amp SSA is reduced, and the SSA can be shared by a greater number of microcells than in the prior art.

A refresh/writeback operation occurs at the primary direct sense amp PSA, enabling faster cacheless designs than in the prior art. The writeback/restore operation is moved to the primary sense amp PSA, and is faster to write a data value back into a memory cell because the global data line PDL does not have to be sensed and inverted (complemented) to provide a proper writeback memory cell voltage, as in the prior art wherein the SSA is utilized in the writeback operation.

Additionally, a localized direct sense architecture provides a truly digital output from each PSA onto the global data line PDL, not a small voltage swing analog signal, such that the localized direct sense architecture is more readily tiled or configured into an array of duplicated identical circuits such as in an eDRAM.

Also the localized direct sense LDS architecture allows 100% bitline shielding because only every other bitline is active during a read operation, and the unselected bitlines act as shields to prevent crosstalk which prevents a loss of bitline read signal and also allows a faster cycle.

BRIEF DESCRIPTION OF THE DRAWINGS

The foregoing objects and advantages of the present invention for a localized direct sense architecture may be more readily understood by one skilled in the art with reference being had to the following detailed description of several embodiments thereof, taken in conjunction with the accompanying drawings wherein like elements are designated by identical reference numerals throughout the several views, and in which.

DETAILED DESCRIPTION OF THE INVENTION

In the localized direct sense architecture and circuits of the present invention, the bias current device is included in each primary sense amp PSA, such that the bias current does not flow along a highly capacitive global data line. With this technical approach, the size of each bias current supply device can be reduced by a factor of 8, and the number of PSAs on one global data line can be doubled for increased layout density.

Figure 1:
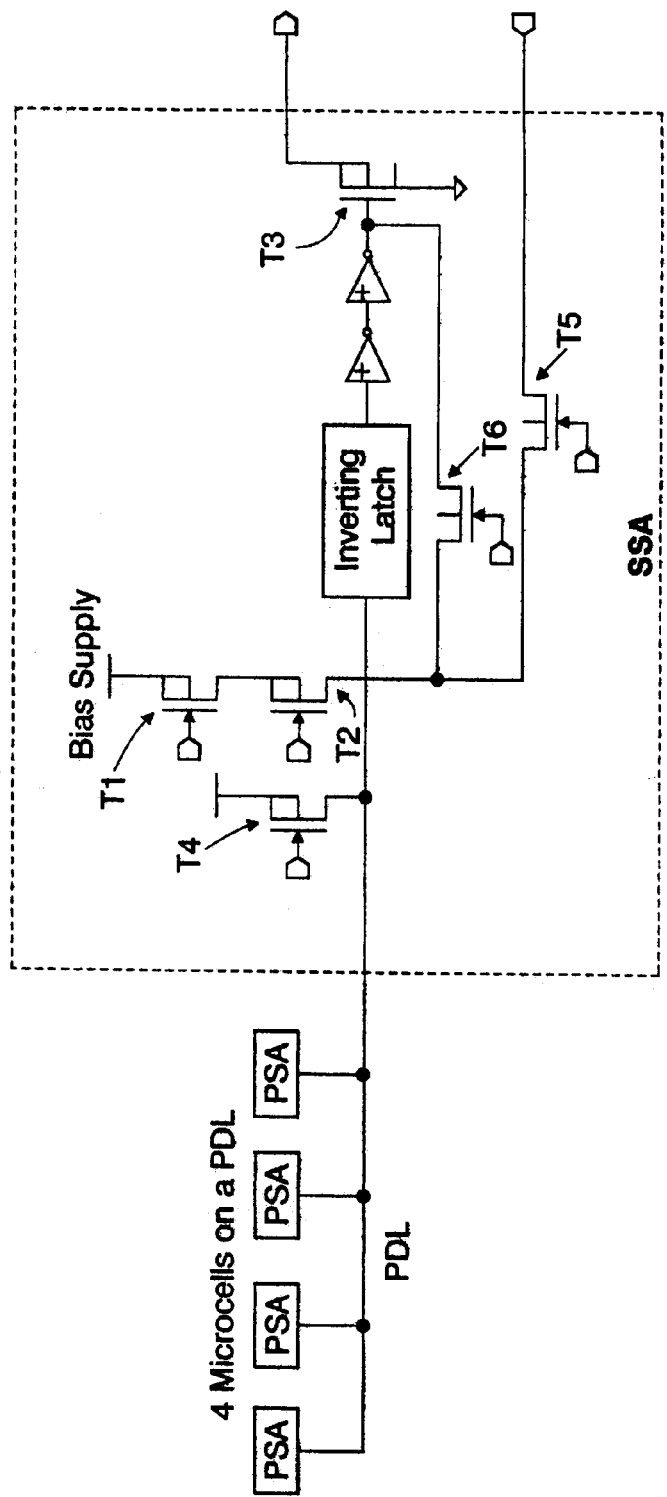
FIG. 1 illustrates a typical prior art direct sense circuit wherein 4 microcells, each having an associated primary sense amp PSA, are coupled to one global data line PDL which is coupled to one secondary sense amp SSA.
Figure 2:
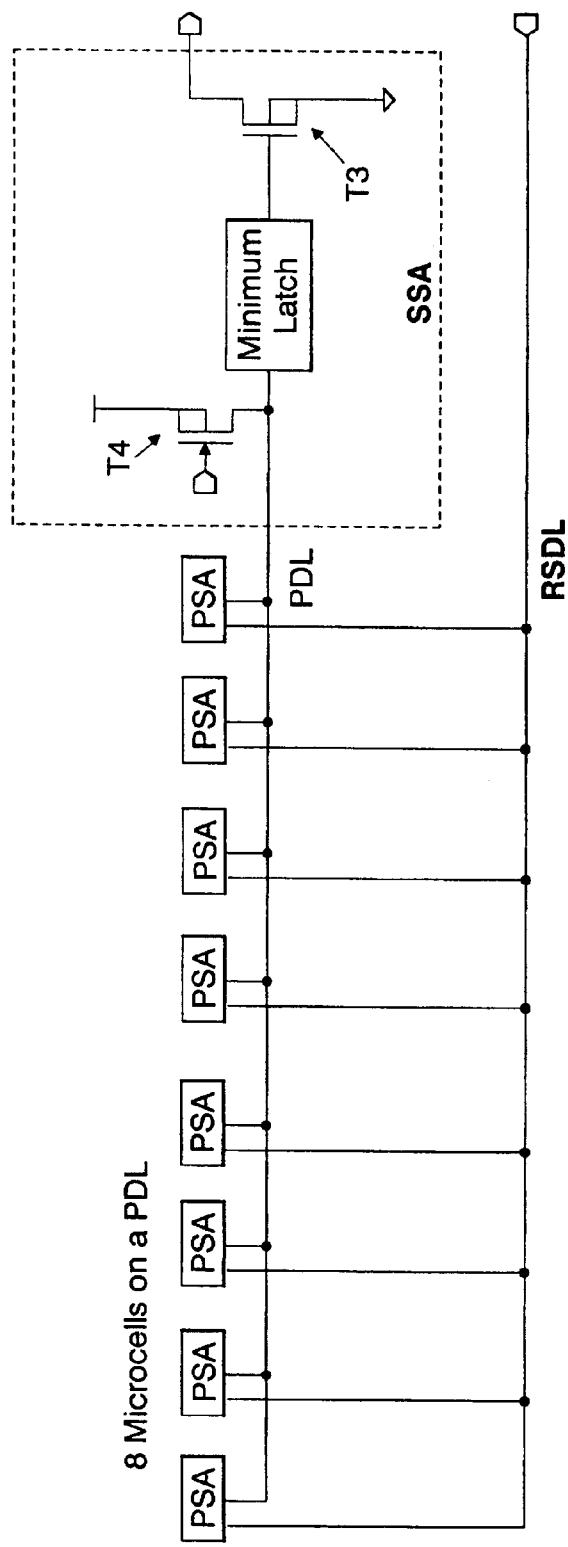
FIG. 2 illustrates a localized direct sense architecture circuit pursuant to the present invention which includes 8 microcells, each having an associated PSA, coupled to one global data line PDL which is coupled to one secondary sense amp SSA.

FIG. 2 illustrates a localized direct sense architecture circuit pursuant to the present invention which includes 8 microcells, each having a primary sense amp PSA, coupled to one global data line PDL which is coupled to one secondary sense amp SSA. The SSA of FIG. 2 is much simpler and smaller than the SSA of FIG. 1, and includes a precharge device T4, an output device T3, and a much smaller inverting Minimum Latch, as the relatively large latch of FIG. 1 is no longer required, which results in a density advantage.

Figure 3:
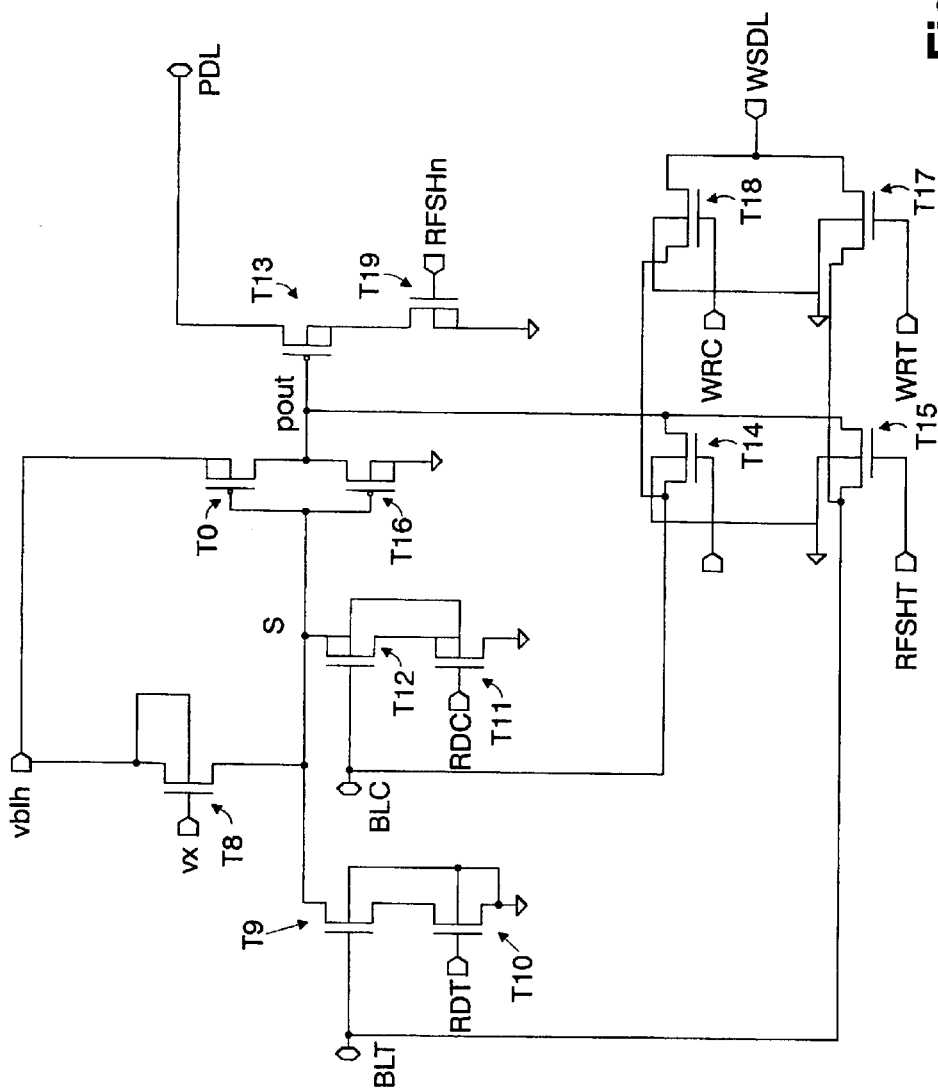
FIG. 3 illustrates a first embodiment of a primary sense amp PSA for a localized direct sense architecture circuit having separate Read and Write (R/W) global data lines and a refresh (RFSH) isolation device.

FIG. 3 illustrates a first embodiment of a primary sense amp PSA for a localized direct sense architecture pursuant to the present invention which includes:

a pair of bitlines BLT, BLC connected to memory storage cells (not shown);

a Read global data line PDL;

a pull down and inverting read NFET device T13 connecting and amplifying a data signal at the output node Pout to the Read global data line PDL while also inverting a data 1 to a data 0 and vice versa;

an output multiplex/refresh NFET device T19 connected in series with the read device T13 to provide a multiplex function to allow simultaneous refresh operations to be conducted for the plurality of PSAs of FIG. 2 without interference or cross-talk between the simultaneous refresh operations;

a Write global data line WSDL;

a pair of write NFET devices T17, T18 connected between the Write global data line WSDL and the respective bitlines BLT, BLC;

a bias current supply PFET device T8 connected between the power supply Vdd and the sense node S;

a pair of sense NFET devices T9, T12 connecting the respective bitlines BLT, BLC to the sense node S;

a pair of sense enable NFET devices T10, T11, connected in series with the sense devices T9, T12;

a buffer/inverter comprising a pair of respective PFET, NFET devices T0, T16 connected between the sense node S and the output node Pout, wherein the buffer/inverter functions to invert and amplify a sense signal at the sense node S and amplifies it to nearly a full rail, digital signal at the output node Pout, and also isolates the sense node S from the relatively large capacitance of the global data line PDL;

a pair of refresh devices T15, T14 connected between the output node Pout and the respective bitlines BLT, BLC, which are turned on during a refresh operation to read the data at node Pout back into the memory during a refresh operation.

In the operation of the circuit of FIG. 3, the read global data line PDL is precharged to Vdd which represents a data 1. If a data 1 exists at Pout and both devices T13 and T19 are turned on, PDL will be discharged through the devices to approach ground. If a data 1 exists at Pout in several of the PSAs connected to PDL, only the PSA selected by activating T19 with signal RFSHn will discharge PDL, which allows a selected read of the selected PSA, without interfering with simultaneous refresh operations in the other PSAs.

In the embodiment of FIG. 3, switching of the global data line PDL is eliminated by the use of an optional device T19 having a control gate signal RFSHn. This design slows down the fall of the global data line PDL in a read operation, but permits a simultaneous refresh of 2 or more primary sense amps PSAs, in the architecture of FIG. 2, on one global data line PDL. Separate global data line PDL (read) and WSDL (write) lines are preferred to avoid the density impact of a write inverter as in the circuit of FIG. 4.

In the PSA circuit of FIG. 3, a current supply device T8 of 5 um is used to precharge the node S, and also provides bias current to each of the direct sense devices T9 and T12. The circuit preferably includes a mimic circuit similar to the mimic circuit disclosed in U.S. Pat. No. 6,438,051, to establish the reference current Vx to the gate of device T8. The node S is used in the mimic primary sense amp PSA to establish the reference current Vx.

The size of the direct sense devices T9 and T12 and their enable devices T10 and T11 can be reduced (to 1.5 um from 4.36 um, for example) because the capacitance to which they are coupled is limited to the capacitance within the primary sense amp PSA and does not include the capacitance of a global data line. Hence, one advantageous feature of the present invention is that a higher speed, higher bandwidth design can be achieved with lower currents and with smaller devices than in prior art circuits.

A second advantageous feature is that the writeback/restore operation is moved to the primary sense amp PSA, and is faster to write a data value back into a memory cell because the global data line PDL does not have to be sensed and inverted (complemented) to provide a proper writeback memory cell voltage, as in the prior art wherein the SSA is utilized in the writeback operation.

A third advantageous feature of the localized direct sense architecture is that the size of the secondary sense amp SSA is reduced, and the SSA can also be shared or amortized over 8 microcells instead of 4 microcells as in the prior art.

A fourth advantageous feature of the localized direct sense architecture is that the global data line PDL now carries a true digital signal, not a small voltage swing analog signal. This makes the localized direct sense architecture more attractive for eDRAM tiled or compiled applications wherein a circuit is duplicated in a matrix of substantially identical circuits.

Figure 4:
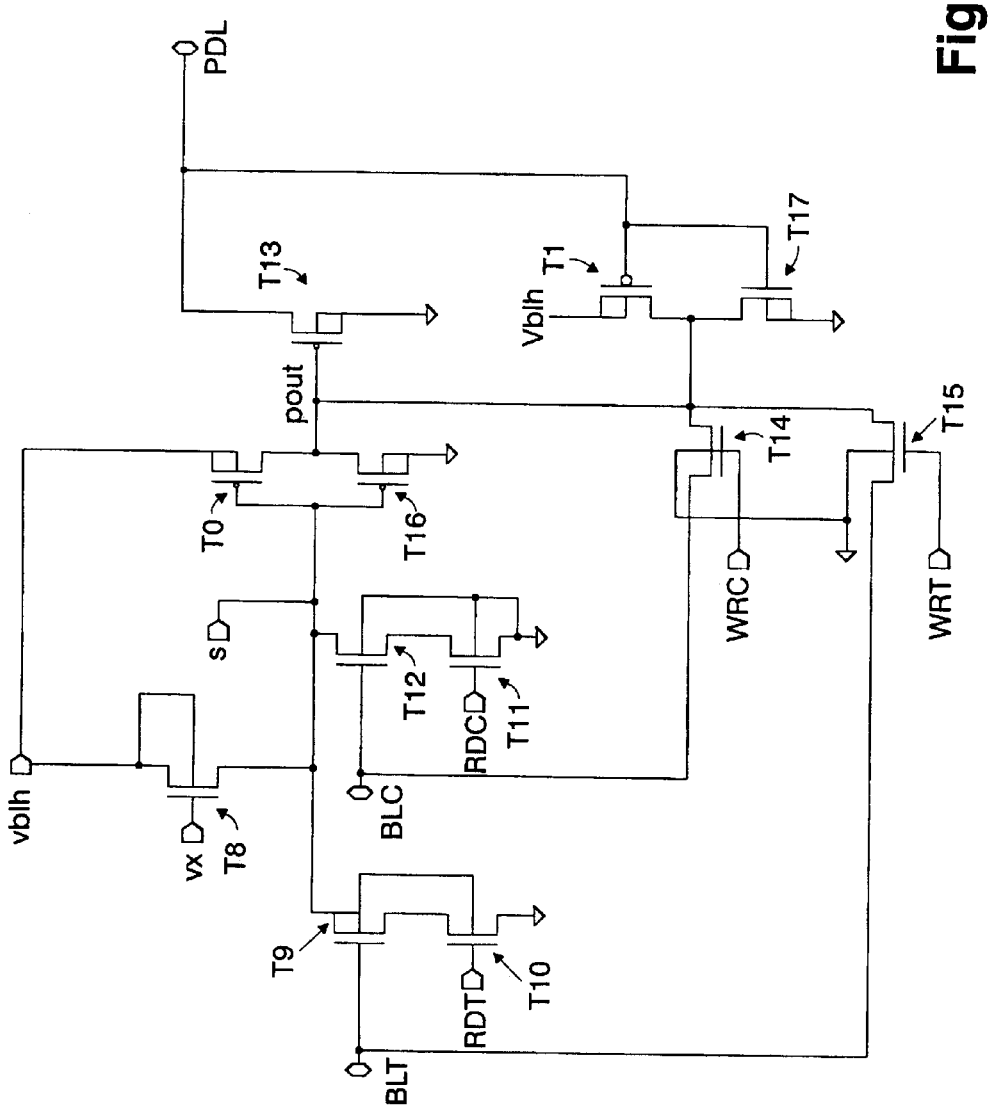
FIG. 4 illustrates a second embodiment of a primary sense amp PSA for a localized direct sense architecture circuit having a single R/W global data line and no refresh isolation device.

FIG. 4 illustrates a second embodiment of a primary sense amp PSA for a localized direct sense architecture having a single R/W global data line and no refresh isolation. The circuit of FIG. 4 is substantially identical to that of FIG. 3 in many respects, and the explanations of the identical components will not be repeated. The circuit of FIG. 4 differs from that of FIG. 3 by having one common PDL Read/Write global data line which is used in all of the read, write and refresh operations, rather than a separate PDL Read global data line and a separate WSDL Write global data line and by the elimination of the internal refresh circuits. The refresh function has been removed from this circuit, including the refresh devices T14, T15, and the multiplex/refresh device T19. Accordingly, the refresh operations for the separate microcells of FIG. 2 must be multiplexed over the global data line PDL, and cannot be performed simultaneously.

Moreover, an inverter/buffer comprising respective PFET, NFET devices T1, T17 has been added to allow refresh operations to be performed with the write devices T14, T15. The read device T13 inverts the data signal at Pout, whereat a high represents a data 1 and a low represents a data 0, such that the data signal is inverted on the PDL global data line. Accordingly, the inverter T1, T17 reinverts the data to a correct polarity data value during a refresh operation, and also provides a full rail signal to the write devices T14, T15 during write and refresh operations.

Area vs. feature trade offs can be made for specific applications. It is important to note that the number of devices in the primary sense amp PSA has been increased over the number of devices in the prior art, but because the capacitance within a primary sense amp PSA is small, the many devices can be a relatively small size. A preliminary layout of the localized direct sense LDS architecture of FIG. 3 came out to within 10% of the prior art layout with its fewer but larger devices.

Computer analyses have compared the response of a localized direct sense architecture circuit using the unstacked version of the primary sense amp of FIG. 4 with the response of a 4 microcell prior art circuit. The results indicated that the response speed is increased by 850 ps in a 3.2 ns cycle even with 8 microcells on a global data line PDL instead of 4 microcells as in the prior art.

The refresh operation is also faster and more efficient, so that a read/writeback operation can take as little as one 5 ns cycle with no cache scheme. The localized direct sense architecture results in a reduction in the sense power relative to the prior art because the number of sense devices and bias current devices is reduced. The response speed or bandwidth is also increased at the lower power because the bias current doesn't charge the highly capacitive global data line PDL. The DC operating point has been maintained while using devices having smaller sizes.

The disclosed preferred embodiment of the present invention describes a memory chip wherein bitlines are precharges to a high level, and sense devices are NFETs. The sense node is precharged high by the bias current and is pulled to voltage levels below precharge during a read to indicate a '1' or '0' data level. The global dataline is also precharged high and is pulled low to indicate a '1' level and remains high if a '0' is sensed. An alternate complimentary embodiment architecture could change precharge levels from VDD to ground, and utilize PFET to NFET, and NFET to PFET duals, and change the sense devices of FIG. 3 to pullup devices. Bias current would be drawn from the sense node and directed to ground instead of being supplied to the sense node.

While several embodiments and variations of the present invention for a localized direct sense architecture are described in detail herein, it should be apparent that the disclosure and teachings of the present invention will suggest many alternative designs to those skilled in the art.

What is claimed is:

1. A localized direct sense archive circuit for a memory having an array of memory storage cells comprising:
   a global data line which is highly capacitive;
   a single secondary sense amp connected to the global data line;
   a plurality of primary sense amps connected along the global data line, wherein each primary sense amp includes a sense node, at least one direct sense device connected between a bitline, which is connected to memory storage cells, and the sense node, and a current supply device conned between a power supply and the sense node to precharge the sense node and also to supply bias current to each direct sense device, such that the bias current does not flow through the highly capacitive global data line.

2. The circuit of claim 1, wherein the primary sense amp includes a writeback/restore circuit to writeback data to the memory.

3. The circuit of claim 1, wherein only the gate of each sense device is connected to the bitline, such that the direct sense device does not provide any feedback to or alter the signal on the bitline.

4. The circuit of claim 1, wherein each primary sense amp includes:
   the bitline connected to memory storage cells;
   read device connecting an output node to the global data line;
   a write device connected between the global data line and the bitline;
   the sense device connecting the bitline to the sense node;
   a direct sense enable device connected in series with the direct sense device;
   a buffer/inverter connected between the sense node and the output node, wherein the buffer/inverter inverts and amplifies a sense signal at the node to a full rail signal at the output node, and also isolates the sense node from the relatively large capacitance of the global data line and read device.

5. The circuit of claim 1, wherein each primary sense amp includes:

the pair of bitlines connected to memory storage cells;

a read device connecting an output node to the global data line;

a pair of write devices connected between the output node line and the respective bitlines;

the pair of sense device connecting tile respective bitlines to the sense node;

a pair of direct sense enable devices, each being connected in series with one of the direct sense devices;

a buffer/inverter connected between the sense node and the output node, wherein the buffer/inverter inverts and amplifies sense signal at the sense node to a full rail signal at the output node, and also isolates the sense node from the relatively large capacitance of the global data line and the read device.

6. The circuit of claim 5, wherein the buffer/inverter comprises a pair of devices.

7. The circuit of claim 1, wherein each primary sense amp is coupled to a separate read global data line and a separate write global data line.

8. The circuit of claim 7, wherein each primary sense amp includes:

the pair of bitlines connected to memory storage cells;

a read device connecting an output node to the read global data line;

an output multiplex/refresh device connected in series with the read device to provide isolation during a refresh operation to allow simultaneous refresh operations to be conducted for the plurality of primary sense amps without interference or cross-talk between the simultaneous refresh operations;

a pair of write devices coupled between the write global data line and the respective bitline;

the pair of sense devices connecting the respective bitlines to the sense node;

a pair of direct sense enable devices, each being connected in series with one of the direct sense devices;

a buffer/inverter, connected between the sense node and output node, for inverting and amplifying a sense signal at the sense node to a full rail signal at the output node, and for also isolating the sense node from the relatively large capacitance of the global data line and the read device;

a pair of refresh devices between the output node and the respective bitlines, which are turned on during a refresh operation to read the data at the output node back into the memory during a refresh operation.

9. The circuit of claim 1, wherein each primary sense amp is coupled to a common write and read global data line, and wherein the refresh operations for the separate primary sense amps must be multiplexed over the global data line and cannot be performed simultaneously.

10. The circuit of claim 9, wherein each primary sense amp includes:

the pair of bitlines connected to memory storage cells;

a read device connecting an output node to the global data line;

a pair of write device connected between the global data line and the respective bitlines;

the pair of sense devices connecting the respective bitlines to the sense node;

a pair of direct sense enable devices, each being connected in series with one of the direct sense devices;

a buffer/inverter connected between the sense node and the output node, wherein the buffer/inverter invert and amplifies a sense signal at the sense node to a full rail signal at the output node, and also isolates the sense node from the relatively large capacitance of the global data line and the read device;

an inverter/buffer, coupled between the global data line and the write devices, to allow refresh operations to be performed with the write devices, wherein the read device produces an inverted data signal at the global data line and the inverter/buffer reinverts the data signal on the global data line to a correct polarity data signal for a refresh operation, and also provides a full rail signal to the write devices during write and refresh operations.

11. A primary sense amp comprising:

a read device connecting an output node to a read global data line;

an output multiplex/refresh device connected in series with the read device to provide isolation during a refresh operation to allow simultaneous refresh operation to be conducted for the plurality of primary sense amps without interference or cross-talk between the simultaneous refresh operations;

a pair of write devices connected between a write global data line and a pair of respective bitlines;

a pair of sense devices connecting the respective bitlines to a sense node;

a pair of direct sense enable devices, each being connected in series with one of the direct sense devices;

a buffer/inverter, connected between the sense node and the output node, for inverting and amplifying a sense signal at the sense node to a full rail signal at the output node, and for also isolating the sense node from the relatively large capacitance of the read global data line and the read device;

a pair of refresh devices connected between the output node and the respective bitlines, which are turned on during a refresh operation to read the data at the output node back into the memory during a refresh operation.

12. A primary sense amp comprising:

a read device connecting an output node to a global data line;

a pair of write devices connected between the global data line and a pair of respective bitlines;

a pair of sense devices connecting the respective bitlines to a sense node;

a pair of direct sense enable devices, each being connected in series with one of the direct sense devices;

a buffer/inverter connected between the sense node and the output node, wherein the buffer/inverter inverts and amplifies a sense signal at the sense node to a full rail signal at the output node, and also isolates the sense node from the relatively large capacitance of the global data line and the read device;

an inverter/buffer, coupled between the global data line and the write devices, to allow refresh operations to be performed with the write devices, wherein the read device produces an inverted data signal at the global data line and the inverter/buffer reinverts the data signal on the global data line to a correct polarity data signal for a refresh operation, and also provides a full rail signal to the write devices during write and refresh operations.

* * * * *